United States Patent
Takeuchi et al.

(10) Patent No.: US 7,790,481 B2
(45) Date of Patent: Sep. 7, 2010

(54) COMPOUND SEMICONDUCTOR LIGHT-EMITTING DEVICE AND PRODUCTION METHOD THEREOF

(75) Inventors: Ryouichi Takeuchi, Chichibu (JP); Wataru Nabekura, Chichibu (JP); Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 12/121,461

(22) Filed: May 15, 2008

(65) Prior Publication Data

US 2008/0268562 A1    Oct. 30, 2008

Related U.S. Application Data

(62) Division of application No. 10/594,065, filed as application No. PCT/JP2005/006520 on Mar. 28, 2005.

(60) Provisional application No. 60/559,429, filed on Apr. 6, 2004.

(30) Foreign Application Priority Data

Mar. 29, 2004 (JP) ............................ P2004-095145

(51) Int. Cl.
*H01L 21/00* (2006.01)

(52) U.S. Cl. .............................. 438/22; 438/46; 257/94; 257/103; 257/E21.001

(58) Field of Classification Search ................. 257/103, 257/E33.023, E33.027, E21.001; 438/22, 438/46

See application file for complete search history.

(56) References Cited

U.S. PATENT DOCUMENTS

| 3,022,452 | A  | 2/1962  | Williams et al. |
| 3,054,936 | A  | 9/1962  | Williams et al. |
| 3,071,715 | A  | 1/1963  | Hill |
| 5,008,718 | A  | 4/1991  | Fletcher et al. |
| 5,403,916 | A  | 4/1995  | Watanabe et al. |
| 6,462,358 | B1 | 10/2002 | Lin et al. |
| 6,607,931 | B2 | 8/2003  | Streubel |

(Continued)

FOREIGN PATENT DOCUMENTS

DE    1162486    12/1899

(Continued)

OTHER PUBLICATIONS

Iwao Teramoto; "Introduction of Semiconductor Device," Mar. 30, 1995, First Edition, Baifukan Co., Ltd., p. 24, line 16 to line 17.

(Continued)

*Primary Examiner*—Lynne A Gurley
*Assistant Examiner*—Vernon P Webb
(74) *Attorney, Agent, or Firm*—Sughrue Mion, PLLC

(57) ABSTRACT

A pn-junction compound semiconductor light-emitting device is provided, which comprises a stacked structure including a light-emitting layer composed of an n-type or a p-type aluminum gallium indium phosphide and a light-permeable substrate for supporting the stacked structure, and the stacked structure and the light-permeable substrate being joined together, wherein the stacked structure includes an n-type or a p-type conductor layer, the conductor layer and the substrate are joined together, and the conductor layer is composed of a Group III-V compound semiconductor containing boron.

3 Claims, 3 Drawing Sheets

U.S. PATENT DOCUMENTS

| | | |
|---|---|---|
| 7,135,713 B2 | 11/2006 | Chen |
| 2003/0047737 A1* | 3/2003 | Lin et al. .................. 257/79 |
| 2003/0141509 A1* | 7/2003 | Udagawa .................. 257/79 |
| 2003/0160253 A1 | 8/2003 | Udagawa |
| 2003/0173573 A1* | 9/2003 | Udagawa .................. 257/88 |
| 2004/0169184 A1 | 9/2004 | Udagawa et al. |
| 2005/0087513 A1* | 4/2005 | Liao et al. .................. 216/54 |
| 2006/0094140 A1 | 5/2006 | Inoguchi et al. |
| 2007/0215886 A1 | 9/2007 | Takeuchi et al. |

FOREIGN PATENT DOCUMENTS

| | | |
|---|---|---|
| DE | 10204386 A1 | 4/2003 |
| JP | 8-130326 | 5/1996 |
| JP | 2588849 | 12/1996 |
| JP | 9-232685 A | 9/1997 |
| JP | 2001-244499 | 9/2001 |
| JP | 3230638 | 9/2001 |
| JP | 2003-86836 A | 3/2003 |
| JP | 2003-229599 A | 8/2003 |
| WO | 03/065465 A2 | 8/2003 |

OTHER PUBLICATIONS

Shiro Yoshizawa, et al.; Industrial Chemistry Basic Lecture 5; "Inorganic Industrial Chemistry," Asakura Publishing Co., Ltd., Feb. 25, 1973, 6th Edition, pp. 169 and 205-208.

Y. Kumasiro et al.; Journal of Solid State Chemistry; "Preparation and Electrical Properties of Boron and Boron Phosphide Films Obtained by Gas Source Molecular Beam Deposition," Apr. 1997, pp. 269-272.

"Duffy Inorganic Chemistry," Hirokawa Publishing Co. Ltd., Tokyo, Fifth Edition, Apr. 15, 1971, p. 249, lines 24-26.

Journal of the Korean Association of Crystal Growth; "Metalorganic VPE growth of GaInP and related semiconductors for mobile communication device application," Apr. 27, 2001, vol. 11, No. 5, pp. 207-210.

Y. Hoskawa, et al.; "High-power ohmic-electrodes dispersive AlGaInP double-hetero structure yellowish-green light-emitting diodes"; Journal of Crystal Growth 221 (2000); pp. 652-656.

Office Action for U.S. Appl. No. 10/594,065; mail date Jun. 23, 2009; confirmation No. 8882.

* cited by examiner 0.30mm

COMPOUND SEMICONDUCTOR LIGHT-EMITTING DEVICE AND PRODUCTION METHOD THEREOF

CROSS-REFERENCE TO RELATED APPLICATION

This is a Divisional of application Ser. No. 10/594,065 filed Sep. 26, 2006, which is a 371 of PCT Application No. PCT/JP2005/006520 filed Mar. 28, 2005, which claims priority from Japanese Application No. 2004-095145, filed Mar. 29, 2004 and which claims benefit pursuant to 35 U.S.C. §119(e)(1) of U.S. Provisional Application No. 60/559,429 filed on Apr. 6, 2004. The above-noted applications are incorporated herein by reference in their entirety.

TECHNICAL FIELD

The present invention relates to a pn-junction compound semiconductor light-emitting device having a stacked structure including a light-emitting layer composed of an aluminum gallium indium phosphide mixed crystal (AlGaInP) and, more particularly, to a pn-junction compound semiconductor light-emitting device attaining high emission intensity.

BACKGROUND ART

Light-emitting diodes (hereinafter also referred to as LEDs) having a light-emitting layer which is composed of an aluminum gallium indium phosphide mixed crystal (compositional formula: $(Al_XGa_{1-X})_YIn_{1-Y}P$, $0 \geq X \geq 1$) and which is vapor-grown on an n-type or p-type gallium arsenide (GaAs) single-crystal substrate are known to emit light having a wavelength corresponding to green light to red light (see, for example, Non-Patent Document 1).

Specifically, an LED having on a GaAs substrate a light-emitting layer composed of an aluminum gallium indium phosphide mixed crystal (($Al_XGa_{1-X})_{0.5}In_{0.5}P$: $0 \leq X \leq 1$) (Y=0.5 in the above compositional formula) is employed.

In an LED having a light-emitting layer composed of $(Al_XGa_{1-X})_YIn_{1-Y}P$, in order to attain high emission intensity, diffusion of device operation current over a wide area of the light-emitting layer and effective extraction of light to the outside are essential. Thus, a current diffusion layer and a window layer are generally provided on the light-emitting layer.

The window layer allows light emitted from the light-emitting layer to transmit to the outside. For example, an LED having a window layer composed of gallium phosphide (GaP) is disclosed (see Patent Document 1).

In an LED having a stacked structure vapor-grown on a GaAs substrate, light emitted from the light-emitting layer can be extracted only from the upper side of the LED, since the GaAs substrate is not transparent with respect to emission wavelength. Thus, efficiency of extracting light to the outside is not satisfactory, which is to be improved.

In order to solve the problem, a method for producing an LED has been proposed. In the method, a substrate which is transparent with respect to emission wavelength is joined onto a stacked structure formed on a GaAs substrate, and the GaAs substrate provided for vapor-growth of the stacked structure is removed.

By virtue of the thus-joined substrate which is transparent with respect to emission wavelength, the LED produced through the above method allows light emission from the upper side as well as from the backside and side planes, thereby attaining high light extraction efficiency.

There have been known such methods for producing an LED including joining, onto a stacked structure having a light-emitting layer, a semiconductor substrate which is transparent with respect to emission wavelength (e.g., GaP, zinc selenide (ZnSe), or silicon carbide (SiC)) (see, for example, Patent Documents 2 and 3).

Another disclosed technique for producing an LED includes joining, onto a stacked structure, a GaP substrate which is transparent with respect to emission wavelength by the mediation of a transparent conductive film such as indium tin complex oxide film (ITO) (see, for example, Patent Document 4).

[Non-Patent Document]
  Y. Hosokawa, Journal of Crystal Growth (Holland), 2000, Vol. 221, p. 652-656

[Patent Document 1]
  U.S. Pat. No. 5,008,718 specification

[Patent Document 2]
  Japanese Patent No. 3230638

[Patent Document 3]
  Japanese Patent Application Laid-Open (kokai) No. 2001-244499

[Patent Document 4]
  Japanese Patent No. 2588849

DISCLOSURE OF THE INVENTION

Problems to be Solved by the Invention

Patent Document 4 also discloses that, when a GaP substrate which is transparent with respect to emission wavelength is joined onto the uppermost surface of a stacked structure including a cladding layer and a current diffusion layer each composed of $(Al_XGa_{1-X})_YIn_{1-Y}P$, joining must be performed by heating at high temperature (830° C. or higher) (see Patent Document 4, paragraph [0007] in the specification).

Patent Document 2 also discloses that, when light-irradiation means such as YAG laser for heating is not employed in combination, a semiconductor substrate which is transparent with respect to emission wavelength is suitably joined onto a stacked structure by heating at 300° C. to 900° C. (see Patent Document 2, paragraph [0035] in the specification).

Under such high-temperature conditions, a Group III-V compound semiconductor which is used for forming a stacked structure and which contains aluminum (Al)—susceptible to oxidation—(e.g., aluminum gallium indium phosphide mixed crystal $((Al_XGa_{1-X})_YIn_{1-Y}P)$ or aluminum gallium arsenide (compositional formula: $Al_XGa_YAs$, $0 \leq X$, $Y \leq 1$, $X+Y=1$) is readily oxidized.

Therefore, a high-resistive layer composed of an oxide or another substance is formed in a junction area between the stacked structure and a light-permeable substrate (e.g., GaP substrate) joined thereto. Such a high-resistance layer may disturb flow of device operation current.

In some stacked structures, a layer composed of an aluminum gallium indium phosphide mixed crystal $((Al_XGa_{1-X})_YIn_{1-Y}P)$ is provided other than the light-emitting layer. Generally, in order to impart conductivity to the mixed crystal layer, an impurity element which readily thermally diffuses such as zinc (Zn) or selenium (Se) is added to the layer.

When a light-permeable substrate is joined to a stacked structure through heating at high temperature, an impurity element which readily thermally diffuses such as zinc (Zn) or selenium (Se) diffuses into a light-emitting layer or another layer. Thus, carrier concentration of an n-type or a p-type light-emitting layer, or forward voltage (Vf) of LEDs may problematically vary.

Patent Document 4 discloses transparent conductive oxide films including iodide tin oxide film and cadmium tin oxide film. However, these oxide films are difficult to attain reliable Ohmic contact with a Group III-V compound semiconductor such as an aluminum gallium indium phosphide mixed crystal (($Al_xGa_{1-x}$)$_y$$In_{1-y}$P).

Thus, even when a transparent substrate having excellent light permeability such as sapphire ($\alpha$-$Al_2O_3$ single-crystal), glass, titanium dioxide ($TiO_2$), or magnesium oxide (MgO) is joined to a stacked structure by the mediation of any of the aforementioned transparent oxide films, diffusion of device operation current by the mediation of the transparent substrate over a wide area of the stacked structure in the produced LED is difficult, which is problematic.

DISCLOSURE OF THE INVENTION

The present invention has been conceived in order to solve the aforementioned problems involved in the conventional techniques. Thus, the invention provides a pn-junction compound semiconductor light-emitting device which has low resistance, allows device operation current to easily flow, and exhibits excellent efficiency of extraction of light to the outside, and a method for producing the device.

Accordingly, the present invention is directed to the following.

(1) A pn-junction compound semiconductor light-emitting device comprising a stacked structure including a light-emitting layer composed of an n-type or a p-type aluminum gallium indium phosphide and a light-permeable substrate for supporting the stacked structure, the stacked structure and the light-permeable substrate being joined together, characterized in that the stacked structure includes an n-type or a p-type conductor layer, that the conductor layer and the substrate are joined together, and that the conductor layer is composed of a Group III-V compound semiconductor containing boron.

(2) A pn-junction compound semiconductor light-emitting device as described in (1) above, wherein the conductor layer has a bandgap at room temperature which is greater than that of the light-emitting layer.

(3) A pn-junction compound semiconductor light-emitting device as described in (1) or (2) above, wherein the conductor layer is composed of an undoped Group III-V compound semiconductor containing boron to which an impurity element has not been intentionally added.

(4) A pn-junction compound semiconductor light-emitting device as described in any one of (1) to (3) above, wherein the conductor layer is composed of a Group III-V compound semiconductor containing arsenic and boron.

(5) A pn-junction compound semiconductor light-emitting device as described in any one of (1) to (4) above, wherein the conductor layer is composed of a Group III-V compound semiconductor containing phosphorus and boron.

(6) A pn-junction compound semiconductor light-emitting device as described in (5) above, wherein the conductor layer is composed of boron phosphide.

(7) A pn-junction compound semiconductor light-emitting device as described in any one of (1) to (6) above, wherein the conductor layer is composed of a boron-containing Group III-V compound semiconductor containing twins.

(8) A pn-junction compound semiconductor light-emitting device as described in (7) above, wherein each of the twins has, as a twinning plane, a (111) lattice plane of a boron-containing Group III-V compound semiconductor.

(9) A method for producing a pn-junction compound semiconductor light-emitting device characterized by comprising a step of forming a stacked structure through sequentially stacking on a crystal substrate a lower cladding layer, a light-emitting layer composed of n-type or p-type aluminum gallium indium phosphide, an upper cladding layer, and an n-type or a p-type conductor layer composed of a boron-containing Group III-V compound semiconductor, and a step of joining the conductor layer to a light-permeable substrate.

(10) A method for producing a pn-junction compound semiconductor light-emitting device as described in (9) above, wherein the crystal substrate is removed after joining of the conductor layer to the light-permeable substrate.

(11) A method for producing a pn-junction compound semiconductor light-emitting device as described in (9) or (10) above, wherein the conductor layer is formed through crystal growth at a growth rate of 20 nm/min to 30 nm/min until the conductor layer thickness reaches 10 nm to 25 nm, followed by crystal growth at a growth rate less than 20 nm/min until the conductor layer comes to have a thickness of interest.

According to the pn-junction compound semiconductor light-emitting device of the present invention, the conductor layer is composed of a boron-containing Group III-V compound semiconductor. Thus, in the pn-junction compound semiconductor light-emitting device, the conductor layer and the light-permeable substrate are joined to each other with high adhesion. On the conductor layer, an Ohmic electrode can be reliably formed.

Therefore, the invention provides a pn-junction compound semiconductor light-emitting device which has low resistance, allows device operation current to easily flow, and exhibits excellent efficiency of extraction of light to the outside.

Since the conductor layer has a bandgap at room temperature which is greater than that of the light-emitting layer, the light emitted from the light-emitting layer can be caused to transmit to the light-permeable substrate with low transmission loss, whereby high emission intensity can be attained.

Since the conductor layer is composed of an undoped Group III-V compound semiconductor containing boron to which an impurity element has not been intentionally added, the phenomenon that the added impurity element diffuses into the light-emitting layer or other layers, thereby varying forward voltage or other properties of a pn-junction compound semiconductor light-emitting device does not occur, and low forward current can be attained.

Since the conductor layer is composed of a Group III-V compound semiconductor containing arsenic and boron, an electrode exhibiting excellent Ohmic contact characteristics can be formed on the conductor layer, whereby low forward current can be attained.

Since the conductor layer is composed of a Group III-V compound semiconductor containing phosphorus and boron or a Group III-V compound semiconductor containing arsenic and boron (boron arsenide phosphide), a wide bandgap is obtained and the light emitted from the light-emitting layer can be caused to transmit to the light-permeable substrate with lower transmission loss, whereby higher emission intensity can be attained.

Since the conductor layer is composed of a boron-containing Group III-V compound semiconductor containing twins, lattice mismatch between the conductor layer and a base layer is mitigated, thereby yielding a conductor layer with high crystallinity. Thus, a pn-junction compound semiconductor light-emitting device which has lower resistance and exhibits excellent efficiency of extraction of light to the outside can be produced.

According to the method for producing a pn-junction compound semiconductor light-emitting device, an n-type or a p-type conductor layer composed of a boron-containing Group III-V compound semiconductor is formed to provide a joining layer for joining the stacked structure and the light-permeable substrate. Thus, the conductor layer and the light-permeable substrate can be joined to each other at low temperature with strong adhesion without using a light-irradiation means such as YAG laser for heating in combination.

According to the method, formation of a high-resistance layer composed of an oxide or another substance and thermal diffusion of an impurity element added to a component layer of the stacked structure can be prevented, such phenomena conventionally occurring in the case where a conductor layer composed of gallium phosphide or a similar substance and a light-permeable substrate are joined at high temperature. On the conductor layer, an Ohmic electrode can be reliably formed.

According to the method, a pn-junction compound semiconductor light-emitting device which has low resistance, allows device operation current to easily flow, and exhibits excellent efficiency of extraction of light to the outside can be produced.

Since the crystal substrate is removed after joining of the conductor layer to the light-permeable substrate, light absorption by the crystal substrate can be avoided, and a pn-junction compound semiconductor light-emitting device which exhibits excellent efficiency of extraction of light to the outside can be produced.

According to the method, the conductor layer is formed through crystal growth at a growth rate of 20 nm/min to 30 nm/min until the conductor layer thickness reaches 10 nm to 25 nm, followed by crystal growth at a growth rate less than 20 nm/min until the conductor layer comes to have a thickness of interest. Therefore, twins are incorporated into the conductor layer, whereby a conductor layer with high crystallinity can be formed.

Since crystal growth is continued at a growth rate less than 20 nm/min until the conductor layer comes to have a thickness of interest, a conductor layer having high surface flatness can be formed, whereby the conductor layer and the light-permeable substrate can be joined to each other with high adhesion.

BEST MODE FOR CARRYING OUT THE INVENTION

Figure 1:
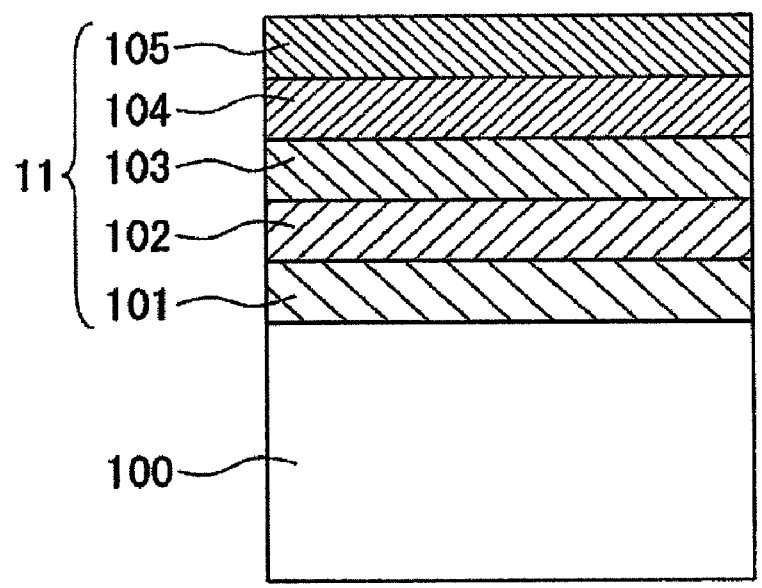
FIG. 1 shows a schematic cross-sectional view of an exemplary stacked structure of Example 1.

A pn-Junction compound semiconductor light-emitting device will be described.

The pn-junction compound semiconductor light-emitting device of the present invention comprises a stacked structure including a light-emitting layer composed of an n-type or a p-type aluminum gallium indium phosphide (compositional formula: $(Al_XGa_{1-X})_{0.5}In_{0.5}P$, $0 \leq X \leq 1$) and a light-permeable substrate for supporting the stacked structure. The stacked structure includes an n-conduction-type or a p-conduction-type conductor layer composed of a boron-containing Group III-V compound semiconductor and serving as a joining layer with respect to the light-permeable substrate. The light-permeable substrate is joined to the conductor layer.

The stacked structure has a pn-junction double-hetero (DH) junction structure. An exemplary stacked structure includes a lower cladding layer (e.g., p-type zinc (Zn)-doped $(Al_{0.7}Ga_{0.3})_{0.5}In_{0.5}P$), a light-emitting layer (e.g., p-type undoped $(Al_{0.4}Ga_{0.6})_{0.5}In_{0.5}P$), and an upper cladding layer (e.g., n-type selenium (Se)-doped $(Al_{0.7}Ga_{0.3})_{0.5}In_{0.5}P$), which are sequentially stacked.

On the conductor layer of the stacked structure, an Ohmic electrode of a first polarity is provided, whereas an Ohmic electrode of the opposite polarity is provided on another component layer (e.g., a buffer layer or a cladding layer) on the side opposite the conductor layer with respect to the light-emitting layer.

Through the above configuration, the light-emitting layer emits light upon passage of forward device operation current between the Ohmic electrodes.

When the stacked structure includes a lower cladding layer composed of n-type $(Al_XGa_{1-X})_YIn_{1-Y}P$, a light-emitting layer, an upper cladding layer composed of p-type $(Al_XGa_{1-X})_YIn_{1-Y}P$, and a conductor layer composed of p-type boron phosphide, which are sequentially stacked, a p-type Ohmic electrode (positive electrode) is provided on the conductor layer, and an n-type Ohmic electrode (negative electrode) is provided on the lower cladding layer, whereby a pn-junction compound semiconductor light-emitting device is fabricated.

The conductor layer and the light-permeable substrate, which form the gist of the present invention, will next be described in detail.

The conductor layer is composed of a boron-containing Group III-V compound semiconductor.

As used herein, the term "boron-containing Group III-V compound semiconductor" refers to a Group III-V compound semiconductor containing as a component element boron (B). Examples include compounds represented by a compositional formula: $B_\alpha Al_\beta Ga_\gamma In_{1-\alpha-\beta-\gamma}P_{1-\delta}As_\delta$ ($0<\alpha 1$, $0 \leq \beta<1$, $0 \leq \gamma<1$, $0<\alpha+\beta+\gamma \leq 1$, $0 \leq \delta<1$); and compounds represented by a compositional formula: $B_\alpha Al_\beta Ga_\gamma In_{1-\alpha-\beta-\gamma}P_{1-\delta}N_\delta$ ($0<\alpha \leq 1$, $0 \leq \beta<1$, $0 \leq \gamma<1$, $0<\alpha+\beta+\gamma \leq 1$, $0 \leq \delta<1$).

When the boron-containing Group III-V compound semiconductor mixed crystal contains a large variety of elements, a mixed crystal layer having consistent compositional proportions is more difficult to form (see Iwao Teramoto, "Introduction of Semiconductor Device," Mar. 30 (1995) Baihukan, 1st Ed. p. 24). Thus, the boron-containing Group III-V compound semiconductor represented by the above formula preferably contains 3 or less component elements so as to form a desirable mixed crystal layer having consistent compositional proportions.

Particularly preferably, the conductor layer is a Group III-V compound semiconductor layer which contains no component element that is susceptible to oxidation (e.g., aluminum (Al)) and which contains boron and phosphorus (P) or arsenic (As) as component elements. Since the conductor layer containing no component element that is susceptible to oxidation (e.g., aluminum (Al)) is highly resistive to oxidation, a high-resistance layer composed of an oxide or another substance which would otherwise be formed through heating of the conductor layer during fabrication of a light-emitting device is prevented. Thus, lowering of conductivity caused by formation of the high-resistance layer can be prevented.

Examples of the Group III-V compound semiconductor containing no component element that is susceptible to oxidation (e.g., aluminum (Al)) and containing boron and phosphorus as component elements (hereinafter the semiconductor is also referred to as a boron-phosphide-based semiconductor) include boron monophosphide (BP), boron gallium phosphide represented by a compositional formula: $B_\alpha Ga_\gamma P$ ($0<\alpha\leq 1$, $0\leq\gamma<1$), boron indium phosphide represented by a compositional formula: $B_\alpha In_{1-\alpha}P$ ($0<\alpha\leq 1$), and boron nitride phosphide represented by a compositional formula: $BP_{1-\delta}N_\delta$ ($0\leq\delta<1$), which is a mixed crystal containing a plurality of Group V elements.

Since a boron-phosphide-based semiconductor containing phosphorus exhibits excellent heat resistance, a conductor layer formed therefrom exhibits enhanced oxidation resistance.

Examples of the Group III-V compound semiconductor containing no component element that is susceptible to oxidation (e.g., aluminum (Al)) and containing boron and arsenic as component elements (hereinafter the semiconductor is also referred to as a boron-arsenide-based semiconductor) include boron arsenide phosphide represented by a compositional formula: $BP_{1-\delta}As_\delta$ ($0\leq\delta<1$).

A conductor layer composed of such a boron-arsenide-based semiconductor exhibits lower resistance as compared with a conductor layer composed of a Group III-V compound semiconductor containing boron and phosphorus (P) serving as a sole Group V element. Through employment of a boron-arsenide-based semiconductor, forward voltage can be lowered.

No particular limitation is imposed on the boron atom concentration (content) of the conductor layer, and the concentration is appropriately modified in accordance with use, emission wavelength, or other factors of the pn-junction compound semiconductor light-emitting device. The conductor layer may be a layer which does not contain a large amount of boron as a component element (e.g., a boron-doped Group III-V compound semiconductor).

When the boron atom concentration is less than $1\times 10^{19}$ $cm^{-3}$, a conductor layer exhibiting sufficient oxidation resistance is difficult to reliably form. Thus, in the below-mentioned step of producing pn-junction compound semiconductor light-emitting device, joining of a conductor layer and a light-permeable substrate is preferably performed in an oxygen-free inert gas atmosphere such as hydrogen ($H_2$), nitrogen ($N_2$), or argon (Ar).

The conduction type of the conductor layer is preferably caused to coincide with that of a component layer of the stacked structure which is in contact with the conductor layer (i.e., a base layer on which the conductor layer is formed).

The conductor layer preferably has a low resistance. Specifically, the conductor layer preferably has a carrier concentration at room temperature of $1\times 10^{19}$ $cm^3$ or more and a resistivity at room temperature of $5\times 10^{-2}$ $\Omega\cdot cm$ or less. The thickness of the conductor layer is preferably adjusted to 50 nm to 5,000 nm.

Such a low-resistance conductor layer having such a thickness may be provided in advance in the stacked structure so as to serve as a window layer through which the light emitted from the light-emitting layer is transmitted to the outside, as a current diffusion layer, or as a similar layer.

The conductor layer preferably has a bandgap at room temperature which is wider than that of the light-emitting layer. By virtue of the bandgap characteristics, the conductor layer absorbs substantially no light emitted from the light-emitting layer and transmits the light to a transparent substrate, whereby excellent light extraction efficiency can be attained. Thus, a light-emitting device which emits high-intensity light can be fabricated.

The bandgap of the boron-containing Group III-V compound semiconductor (conductor layer) may be determined on the basis of photon energy ($=h\cdot\nu$) dependency of absorbance or on the basis of photon energy dependency of a product ($=2\cdot n\cdot k$) of refractive index (n) and extinction coefficient (k).

When the conductor layer is composed of a boron-phosphide-based semiconductor or boron arsenide phosphide (one of boron-arsenide-based semiconductor), a wide bandgap can be attained.

Particularly preferably, the conductor layer is composed of boron monophosphide, which attains a wide bandgap at room temperature of 2.8 eV to 5.0 eV For example, a boron monophosphide conductor layer having a bandgap at room temperature of 2.8 eV or more can be formed through MOCVD at a formation rate of 2 nm/min to 30 nm/min.

When the conductor layer has a bandgap at room temperature in excess of 5.0 eV, the energy gap between the conductor layer and the light-emitting layer or the cladding layer excessively increases, which is not preferred for lowering forward voltage or threshold voltage of the pn-junction compound semiconductor light-emitting device.

For example, when the light-emitting layer of a red-light-emitting pn-junction compound semiconductor light-emitting device is composed of aluminum gallium indium phosphide which is represented by a compositional formula: $(Al_X Ga_{1-X})_Y In_{1-Y}P$ and has a bandgap at room temperature of 2.0 eV, a conductor layer composed of boron arsenide phosphide ($BP_{1-\delta}As_\delta$: $0\leq\delta<1$) and having a bandgap at room temperature of 2.3 eV can be employed.

When the conductor layer is composed of a boron-phosphide-based semiconductor or a boron-arsenide-based semiconductor, the semiconductor forming the conductor layer is preferably a semiconductor to which no impurity element has intentionally been added (i.e., an undoped semiconductor).

As compared with conventional semiconductor materials such as aluminum arsenide represented by a compositional formula: $Al_X Ga_Y As$ ($0\leq X$, $Y\leq 1$, $X+Y=1$) and aluminum gallium indium phosphide represented by a compositional formula: $Al_X Ga_Y In_Z P$ ($0\leq X$, $Y$, $Z\leq 1$, $X+Y+Z=1$), a boron-phosphide-based semiconductor or a boron-arsenide-based semiconductor exhibits smaller ionic bond property. Therefore, even though the semiconductor is undoped, low resistance and wide bandgap can be attained.

For example, when boron monophosphide (BP)—type of boron-phosphide-based semiconductor—is employed, a conductor layer having a carrier concentration as high as $10^{19}$ $cm^{-3}$ to $10^{20}$ $cm^3$ can be readily formed in an undoped state.

Conventionally, in some cases, a doped conductor layer to which an impurity element has been intentionally added (e.g., zinc (Zn)-doped GaP) is provided. In a light-emitting device having such a conductive layer, the impurity element (zinc) diffusing from the conductor layer may vary carrier concentration and conduction type of the light-emitting layer. In this case, forward voltage (Vf) deviating from the voltage of interest may be applied, or light of a wavelength deviating from the wavelength of interest may be emitted.

In contrast, when a conductor layer composed of an undoped boron-phosphide-based semiconductor or boron-arsenide-based semiconductor is provided, the amount of impurity element diffusing from the conductor layer into a component layer of the stacked structure which is in contact with the conductor layer or into the light-emitting layer can be reduced, whereby deterioration in characteristics of the light-emitting layer which would otherwise be caused by diffusion of external impurity elements can be prevented. In addition, diffusion of device operation current over the light-emitting layer can be facilitated by virtue of low resistance.

Therefore, such a boron-containing Group III-V compound semiconductor layer, having low resistance and wide bandgap even in an undoped state, may be suitably employed as a cladding layer which does not deteriorate characteristics of an $(Al_xGa_{1-x})_yIn_{1-y}P$ light-emitting layer which would otherwise be caused by diffusion of external impurity elements or a current diffusion layer for diffusing device operation current over the light-emitting layer. Furthermore, the boron-containing Group III-V compound semiconductor layer having a wide bandgap may also serve as a light-transmitting layer through which light emitted from the light-emitting layer is transmitted through the substrate to the outside.

For this reason, the stacked structure may include the aforementioned boron-containing Group III-V compound semiconductor layer, having low resistance and wide bandgap even in an undoped state, serving as a cladding layer or a current diffusion layer, or the boron-containing Group III-V compound semiconductor layer having a wide bandgap serving as a light-transmitting layer.

The conductor layer preferably contains twins.

When twins are formed in an area in the vicinity of the junction interface between a component layer of the stacked structure which is in contact with the conductor layer (i.e., a base layer on which the conductor layer is formed) and the conductor layer, lattice mismatch between the conductor layer and the base layer is mitigated, whereby a conductor layer composed of a boron-containing Group III-V compound semiconductor with few misfit dislocations can be formed.

Particularly, each of the twins more preferably has, as a twinning plane, a (111) crystal plane of a Group III-V compound semiconductor containing boron. In this case, lattice mismatch between the conductor layer and the base layer is further mitigated.

Next, the light-permeable substrate for supporting the stacked structure will be described in detail.

The light-permeable substrate is composed of a material which is transparent with respect to emission wavelength. The light-permeable substrate is preferably formed of a glass material, whichever conduction type and material of the conductor layer are selected.

Examples of the glass material include silica glass (see Shiro Yoshizawa et al., Industrial chemistry basic lecture 5 "Inorganic Industrial Chemistry," Asakura-shoten, Feb. 25 (1973), 6th ed., p. 169); silicate glass such as soda-lime glass (see the above "Inorganic Industrial Chemistry," p. 205-206); borosilicate glass in which silica is partially substituted by boron oxide (see the above "Inorganic Industrial Chemistry," p. 207), and other amorphous glass materials. Specific examples include 96% silica glass.

Particularly, the light-permeable substrate is preferably composed of a glass material having small thermal expansion coefficient such as borosilicate glass (see the above "Inorganic Industrial Chemistry," p. 208) or glass-ceramics. By use of such a substrate, thermal stress between the light-permeable substrate and the stacked structure joined to the light-permeable substrate can be mitigated. Thus, even when a light-emitting device includes a light-emitting layer composed of, for example $(Al_xGa_{1-x})_{0.5}In_{0.5}P$, cracking of the stacked layer which would otherwise be caused by thermal stress can be prevented, thereby attaining excellent thermal stability.

The light-permeable substrate preferably has a refractive index which is smaller than that of the boron-containing Group III-V compound semiconductor. Specifically, the light-permeable substrate preferably has a refractive index of 1.3 or more and less than 2.0, more preferably 1.5 to 1.8.

Examples of optical glass material forming the light-permeable substrate having a refractive index of 1.5 to 1.8 with respect to sodium (Na) d-ray (587 nm), which can be emitted from a light-emitting layer represented by a compositional formula: $(Al_xGa_{1-x})_yIn_{1-y}P$, include crown (K), borosilicate crown (BK), barium crown (BaK), flint (F), barium flint (BaF), lanthanum crown (LaK), lanthanum flint (LaF) (see the above "Inorganic Industrial Chemistry," p. 214).

Other than glass materials, the light-permeable substrate may be formed of a material which is permeable with respect to light emitted from a light-emitting layer represented by a compositional formula: $(Al_xGa_{1-x})_yIn_{1-y}P$ and which allows the light emitted from the light-emitting layer to transmit without absorption.

Examples of the non-glass material forming the light-permeable substrate include Group II-VI compound semiconductors such as zinc oxide (ZnO), zinc sulfide (ZnS), and zinc selenide (ZnSe); silicon carbide (SiC) of cubic 3C-type, hexagonal 4H-type, hexagonal 6H-type, or 15R-type; sapphire ($\alpha$-$Al_2O_3$ single crystal); gallium nitride (GaN); and aluminum nitride (AlN).

When the light-permeable substrate contains a conductive substance such as GaN or ZnSe, the conduction type of the light-permeable substrate preferably coincides with that of the conductor layer.

[Method for Producing a Pn-Junction Compound Semiconductor Light-Emitting Device]

Firstly, a stacked structure is formed through sequentially stacking on a crystal substrate a lower cladding layer, a light-emitting layer composed of n-type or p-type aluminum gallium indium phosphide, an upper cladding layer, an n-type or a p-type conductor layer composed of a boron-containing Group III-V compound semiconductor.

Examples of the crystal substrate include a silicon (Si) crystal, sapphire ($\alpha$-$Al_2O_3$ single-crystal), hexagonal or cubic silicon carbide (SiC), gallium nitride (GaN), gallium arsenide (GaAs), and those crystal substrates having thereon a base layer composed of a Group III-V semiconductor layer.

The lower cladding layer, light-emitting layer, and upper cladding layer may be formed through a conventional vapor phase growth means such as MOCVD (metal-organic chemical vapor deposition). Needless to say, a buffer layer composed of a Group III-V semiconductor such as gallium arsenide (GaAs) may be formed on the crystal substrate, followed by forming these component layers.

The conductor layer composed of a boron-containing Group III-V compound semiconductor is formed on the upper cladding layer through a vapor phase growth means such as the halogen method, the hydride method, or MOCVD (metal-organic chemical vapor deposition), or molecular-beam epitaxy (see J. Solid State Chem., 133 (1997), p. 269-272).

For example, a conductor layer composed of p-type or n-type boron monophosphide (BP) may be formed through an atmospheric pressure (near atmospheric pressure) or reduced-pressure MOCVD by use of triethylborane (molecular formula: $(C_2H_5)_3B$) and phosphine (molecular formula: $PH_3$) as sources.

During formation of the conductor layer composed of p-type boron monophosphide (BP), the formation temperature is preferably 1,000° C. to 1,200° C., and the source supply ratio (V/III ratio; e.g., $PH_3/(C_2H_5)_3B$) is preferably 10 to 50.

During formation of the conductor layer composed of n-type boron monophosphide (BP), the formation temperature is preferably 700° C. to 1,000° C., and the V/III ratio is preferably 200 or more, more preferably 400 or more.

Through precise control of formation rate in addition to formation temperature and V/III ratio, there can be formed a conductor layer composed of a boron-phosphide-based semiconductor which exhibits a wide bandgap at room temperature.

Particularly when the formation rate during MOCVD is controlled to 2 nm/min to 30 nm/min, a conductor layer which is composed of boron monophosphide and which exhibits a bandgap at room temperature of 2.8 eV or more can be produced.

As described below, a conductor layer of high crystallinity can be formed through employment of an increased growth rate in an initial stage of formation of the conductor layer.

One exemplary boron-containing Group III-V compound semiconductor for forming the conductor layer is boron phosphide. The sphalerite-crystal-type boron phosphide has a lattice constant of 0.454 nm, and sphalerite-crystal-type boron arsenide (BAs) has a lattice constant of 0.477 nm. Thus, these lattice constants do not match the lattice constant of $(Al_xGa_{1-x})_yIn_{1-y}P$ serving as a light-emitting layer or cladding layer.

For example, gallium phosphide (GaP) has a lattice constant of 0.545 nm, and lattice mismatch between $(Al_xGa_{1-x})_yIn_{1-y}P$ and boron phosphide is about 16.7%, based on gallium phosphide (GaP).

In the case where a conductor layer composed of a boron-containing Group III-V compound semiconductor (e.g., boron phosphide) is deposited on a cladding layer having such a high mismatch degree, a desirable conductor layer of high crystallinity can be produced through increasing the growth rate in an initial stage of the growth.

For example, when a conductor layer composed of undoped boron phosphide is formed on a layer such as a cladding layer composed of undoped $(Al_{0.5}Ga_{0.5})_{0.5}In_{0.5}P$ at 700° C. to 950° C., the growth rate in an initial stage of the growth is preferably 20 nm/min to 30 nm/min.

As used herein, the growth rate is a value derived by dividing the layer thickness of the grown conductor layer by the time required for obtaining the thickness.

The aforementioned increased growth rate is exclusively employed until the layer thickness reaches 10 nm to 25 nm. Subsequently, crystal growth is continued at a reduced growth rate of less than 20 nm/min until a thickness of interest is obtained, thereby forming a conductor layer.

When a conductor layer is grown at a growth rate in excess of 30 nm/min until a thickness of interest is obtained, the formed conductor layer has a disordered surface with less flatness. Such a surface is not preferred, since sufficient adhesion to the below-mentioned light-permeable substrate fails to be attained.

When a boron-containing Group III-V compound semiconductor forming the conductor layer is grown on, for example, a cladding layer composed of, for example, $Al_xGa_yAs$ ($0 \leq X, Y \leq 1, X+Y=1$) at the aforementioned high growth rate, twins can be formed in a joining layer (in an area in the vicinity of the junction interface between the cladding layer (or a similar layer) and the conductor layer).

The twins formed in the conductor layer (in an area in the vicinity of the junction interface between the cladding layer (or a similar layer) and the conductor layer) can mitigate lattice mismatch between the cladding layer (or a similar layer) and the conductor layer, whereby a conductor layer containing few misfit dislocations can be formed.

Particularly, through formation of twins each having, as a twinning plane, a (111) lattice plane of a boron-containing Group III-V compound semiconductor, lattice mismatch is further mitigated.

Particularly when the aforementioned growth rate in an initial growth stage is controlled to 20 nm/min to 30 nm/min, twins each having a (111) lattice plane as a twinning plane can be generated.

As described above, a stacked structure having a conductor layer serving as a joining layer with respect to the light-permeable substrate can be formed.

Next, the conductor layer of the stacked structure is joined to the light-permeable substrate through the following procedure.

Examples of the light-permeable substrate include Group II-VI compound semiconductors such as zinc oxide (ZnO), zinc sulfide (ZnS), and zinc selenide (ZnSe); silicon carbide (SiC) of cubic 3C-type, hexagonal 4H-type, hexagonal 6H-type, or 15R-type; sapphire ($\alpha$-$Al_2O_3$ single-crystal); gallium nitride (GaN); and aluminum nitride (AlN). When the substrate composed of such a single crystal is employed, the conductor layer and the light-permeable substrate are joined to each other such that the mismatch in crystal lattice spacing therebetween is preferably reduced as small as possible. By virtue of the joining feature, stress applied to the light-emitting layer during joining of the joining layer and the light-permeable substrate can be reduced.

For example, the interplane spacing of a (110) lattice plane of boron monophosphide (lattice constant=0.454 nm) is 0.320 nm, while wurtzite-type crystal gallium nitride has an a-axis lattice constant of 0.319 µm. Thus, when a conductor layer composed of boron monophosphide is joined to a light-permeable substrate composed of a gallium nitride (0001) crystal plane, the conductor layer and the substrate are heated at, for example, 450° C., with positioning such that the (110) lattice plane of boron monophosphide forming the joining layer and the a-axis of GaN forming the light-permeable substrate are arranged in the same direction.

When a light-permeable substrate composed of a glass material is used, the conductor layer and the light-permeable substrate may be joined to each other through an anodic joining means.

When the conductor layer and the light-permeable substrate are joined to each other through an anodic joining means, the negative (−) voltage applied to a glass plate serving as the light-permeable substrate is preferably 100 V to 1,200 V. As the applied voltage increases, joining can be performed easier. However, yield of joined products decreases. Therefore, the applied voltage is preferably 200 V to 700 V, more preferably 300 V to 500 V.

Upon joining through an anodic joining means, the conductor layer and the light-permeable substrate is preferably joined to each other while heating the layer and the substrate. Heating facilitates joining.

The heating temperature is preferably 200° C. to 700° C. When the heating temperature during joining is higher, the voltage applied to the conductor layer and the light-permeable substrate is required to be lowered.

In the case where the conductor layer and the light-permeable substrate are joined to each other through an anodic joining means, the light-permeable substrate is preferably composed of a glass material containing an alkaline component. Examples of such a glass material include borosilicate glass such as soda-lime glass.

Among them, borosilicate glass, which contains boron as a component, provides excellent adhesion with respect to a Group III-V compound semiconductor layer also containing boron as a component element. The substrate composed of a glass material preferably has a thickness of 0.1 mm to 1.0 mm.

Alternatively, the conductor layer and the light-permeable substrate may be joined to each other by use of a conductive liquid (paste or gel) containing a conductive oxide powder.

In one specific mode, the conductor layer and the light-permeable substrate are joined to each other by use of a conductive gel containing indium tin complex oxide through a sol-gel means.

When a compound semiconductor device has a conductor layer having a wide bandgap allowing the light emitted from the light-emitting layer to sufficiently transmit, a metallic material coating film that reflects the light emitted from the light-emitting layer may be formed on a joining surface of the conductor layer or the light-permeable substrate, and the conductor layer and the light-permeable substrate may be joined by use of a conductive paste.

For example, a coating film of a metallic material such as any of the six metals belonging to the platinum group including platinum (Pt), iridium (Ir), and rhodium (Rh) (see "Duffy Inorganic Chemistry," Hirokawa-shoten, Apr. 15 (1971), 5th ed., p. 249), silver (Ag), chromium (Cr), etc. is formed on a conductor layer. The metallic-film-coated surface of the conductor layer is disposed so as to oppose a light-permeable substrate (e.g., glass substrate) and joined to the light-permeable substrate with a conductive paste. Through formation of a light-reflective metallic film on a joining surface of the conductor layer or the light-permeable substrate, a flip-mounted pn-junction compound semiconductor light-emitting device for emitting high-intensity light can be fabricated.

On the conductor layer, an Ohmic electrode of a first polarity is formed, whereas an Ohmic electrode of the opposite polarity is provided on another component layer of the stacked structure (e.g., a buffer layer or a cladding layer) on the side opposite the conductor layer with respect to the light-emitting layer. The Ohmic electrodes may be formed through any known method such as sputtering or vapor deposition.

For example, when the stacked structure includes a lower cladding layer composed of n-type $(Al_xGa_{1-x})_yIn_{1-y}P$, a light-emitting layer, an upper cladding layer composed of p-type $(Al_xGa_{1-x})_yIn_{1-y}P$, and a conductor layer composed of p-type boron phosphide, which are sequentially stacked, a p-type Ohmic electrode (positive electrode) is provided on the conductor layer, and an n-type Ohmic electrode (negative electrode) is provided on another component layer on the side opposite the conductor layer with respect to the light-emitting layer; i.e., on the lower cladding layer.

On the n-type conductor layer composed of, for example, boron-phosphide-based semiconductor or a boron-arsenide-based semiconductor, an n-type Ohmic electrode may be formed from a gold (Au) alloy such as gold (Au)-germanium (Ge).

On the p-type conductor layer composed of, for example, boron-phosphide-based semiconductor or a boron-arsenide-based semiconductor, a p-type Ohmic electrode may be formed from conventionally employed nickel (Ni) (see DE (west Germany) U.S. Pat. No. 1,162,486), nickel alloy, gold (Au)-zinc (Zn) alloy, gold (Au)-beryllium (Be) alloy, or the like.

When the Ohmic electrode having a multi-layer structure is formed, the uppermost layer is preferably formed of gold (Au) or aluminum (Al) in order to facilitate bonding. In the case where the Ohmic electrode having a tri-layer structure is formed, an intermediate layer provided between the bottom portion and the uppermost layer is formed of a transition metal (e.g., titanium (Ti) or molybdenum (Mo)) or platinum (Pt).

As described above, through formation of Ohmic electrodes after joining of the conductor layer and the light-permeable substrate, a pn-junction compound semiconductor light-emitting device is fabricated. In the present invention, after joining of the conductor layer and the light-permeable substrate, the crystal substrate used for vapor-growing of the stacked structure is preferably removed. Through removal of the crystal substrate, a pn-junction compound semiconductor light-emitting device exhibiting high efficiency of extraction of light to the outside can be produced.

Particularly when the crystal substrate is a GaAs substrate, which has a narrow bandgap and absorbs light emitted from the light-emitting layer, a pn-junction compound semiconductor light-emitting device exhibiting high emission intensity can be produced through removal of the crystal substrate.

The crystal substrate may be removed through a conventional etching technique. Specifically, a GaAs crystal substrate can be removed through wet-etching with a liquid mixture containing aqueous ammonia and aqueous hydrogen peroxide.

In contrast, when the crystal substrate is, for example, a gallium phosphide (GaP) substrate, which is composed of a material allowing light emitted from the light-emitting layer to transmit, a pn-junction compound semiconductor light-emitting device exhibiting high emission intensity can be produced without intentionally removing the crystal substrate.

For example, since a gallium phosphide crystal substrate has conductivity, an Ohmic electrode of a first polarity is provided on the backside of the gallium phosphide crystal substrate, and an Ohmic electrode of the opposite polarity is provided on a stacked structure component layer (e.g., a conductor layer), whereby a pn-junction compound semiconductor light-emitting device exhibiting high emission intensity can be produced.

The method of the present invention for producing a pn-junction compound semiconductor light-emitting device will next be described in more detail, with reference to an exemplary method for producing a pn-junction compound semiconductor light-emitting device. In the method, a stacked structure is formed on a crystal substrate which absorbs light emitted from an n-type light-emitting layer (e.g., GaAs substrate), and a pn-junction compound semiconductor light-emitting device exhibiting high efficiency of extraction of light to the outside is produced from the stacked structure.

(1) Through an MOCVD means, a lower cladding layer composed of p-type $(Al_xGa_{1-x})_{0.5}In_{0.5}P$, a light-emitting layer composed of $(Al_xGa_{1-x})_{0.5}In_{0.5}P$, and an upper cladding layer composed of n-type $(Al_xGa_{1-x})_{0.5}In_{0.5}P$ are sequentially stacked on a crystal substrate, for example, a zinc-doped p-type GaAs crystal substrate, to thereby form a double-hetero (DH) junction light-emitting portion ((J. Korean Association of Crystal Growth), 2001, Vol. 11, No. 5, p. 207-210).

Needless to say, p-type GaAs buffer layer may be formed on the p-type zinc-doped GaAs crystal substrate.

(2) Subsequently, on the upper cladding layer of the double-hetero (DH) junction light-emitting portion, a conductor layer composed of n-type undoped boron phosphide is vapor-phase-grown through an MOCVD means, to thereby form a stacked structure including the double-hetero (DH) junction light-emitting portion and the conductor layer.

(3) Then, the conductor layer serving as the uppermost surface of the stacked structure and a colorless transparent substrate composed of low-melting-point glass are joined to each other through an anodic joining means.

(4) The GaAs substrate used for forming the stacked structure is removed from the stacked structure through etching.

Thereafter, Ohmic electrodes are formed through the following procedure, to thereby fabricate a light-emitting device.

(5) A p-type Ohmic electrode is formed directly on a surface of the p-type GaAs buffer layer or the lower cladding layer, the surface being exposed through removal of the GaAs substrate.

(6) Thereafter, a portion throughout the lower cladding layer, light-emitting layer, and upper cladding layer corresponding to the area where an n-type Ohmic electrode is to be formed is removed through etching, thereby exposing the aforementioned n-type boron phosphide layer.

(7) on the thus-exposed conductor layer, an n-type Ohmic electrode is directly formed, to thereby fabricate a pn-junction compound semiconductor light-emitting device.

As described above, a pn-junction compound semiconductor light-emitting device which emits light through plane on the light-permeable substrate side can be produced by removing a GaAs substrate and forming one Ohmic electrode on the conductor layer and the other Ohmic electrode on another component layer on the side opposite the conductor layer with respect to the light-emitting layer. Through employment of the pn-junction compound semiconductor light-emitting device, a flip-chip-type light-emitting device can be fabricated.

For example, a so-called flip-mounted-type light-emitting device, employing extraction of light emitted from a light-emitting layer through a light-permeable substrate, may be fabricated through the following procedure. An n-type Ohmic electrode and a p-type Ohmic electrode are provided such that the two electrodes are disposed to face to the circuit substrate, and the light-permeable substrate faces upward (outwardly). A metal bump electrode is formed on each Ohmic electrode, and the n-type and the p-type Ohmic electrodes are connected to the circuit substrate via the metal bumps.

Alternatively, a similar light-emitting device may also be fabricated by mounting a pn-junction compound semiconductor light-emitting device on a stem, while a light-permeable substrate faces the stem, followed by bonding the n-type and the p-type Ohmic electrodes to the corresponding external electrodes, respectively. In this case, when a reflecting mirror is provided on the stem so as to reflect the light emitted from the light-emitting layer through the light-permeable substrate, the light emitted from the light-emitting layer can be fully utilized, and high-luminance light-emitting devices such as an LED lamp and a light source can be fabricated.

EXAMPLES

Example 1

The present invention will next described in detail by way of Example 1, in which a conductor layer composed of undoped n-type boron arsenide phosphide and a light-permeable substrate composed of a glass material are joined to each other, to thereby form a pn-junction compound semiconductor light-emitting device.

FIG. 1 is a schematic cross-sectional view of an exemplary stacked structure 11 having a pn-junction double-hetero (DH) junction structure and formed on a crystal substrate.

Firstly, a stacked structure 11 forming the pn-junction compound semiconductor light-emitting device 10 (hereinafter the device may be referred to as an LED chip) was formed through the following procedure.

The stacked structure 11 was formed through sequentially stacking on a (100) crystal plane of a zinc (Zn)-doped p-type gallium arsenide (GaAs) single-crystal substrate 100 the following layers: a zinc-doped p-type GaAs buffer layer 101, a lower cladding layer 102 composed of a zinc-doped aluminum gallium indium phosphide mixed crystal $((Al_{0.70}Ga_{0.30})_{0.50}In_{0.50}P)$, an undoped n-type light-emitting layer 103 composed of $(Al_{0.14}Ga_{0.86})_{0.50}In_{0.50}P$, and a selenium (Se)-doped n-type upper cladding layer 104 composed of $(Al_{0.70}Ga_{0.30})_{0.50}In_{0.50}P$ (see J. Korean Association of Crystal Growth, 11(5)(2001), p. 207-210).

The layers 101 to 104 were vapor-phase-grown on the substrate 100 at 720° C. through a conventional reduced-pressure MOCVD means.

On the upper cladding layer 104, an undoped n-type boron arsenide phosphide $(BAs_{0.08}P_{0.92})$ layer was deposited, to thereby form a conductor layer 105.

The conductor layer 105 composed of undoped n-type boron arsenide phosphide $(BAs_{0.08}P_{0.92})$ was formed through an atmospheric pressure (near atmospheric pressure) metal-organic chemical vapor deposition (MOCVD) means by use of triethylborane (molecular formula: $(C_2H_5)_3B$) as a boron (B), arsine gas (molecular formula: $AsH_3$) as an arsenic (As) source, and phosphine (molecular formula: $PH_3$) as a phosphorus (P) source. The thickness of the conductor layer 105 was adjusted to 850 nm.

The method for forming the conductor layer 105 will next be described in detail.

The same conditions under which boron monophosphide (BP) having a bandgap at room temperature of about 4.3 eV was formed were employed. That is, crystal growth of undoped n-type boron arsenide phosphide $(BAs_{0.08}P_{0.92})$ was initiated under the conditions: a V/III ratio $((AsH_3+PH_3)/(C_2H_5)_3B)$ concentration ratio) of 800, a growth temperature of 700° C., and a growth rate of 25 nm/min.

Crystal growth of undoped n-type boron arsenide phosphide $(BAs_{0.08}P_{0.92})$ was carried out at a growth rate of 25 nm/min for eight minutes. When the layer thickness reached 200 nm, the growth rate is lowered to 15 nm/min, and crystal growth was continued at the lowered growth rate.

Finally, when the thickness of the conductor layer 105 reached 850 nm, crystal growth was terminated.

The thus-formed conductor layer 105 was found to have a bandgap at room temperature of 3.5 eV. The carrier concentration and the resistivity at room temperature were found to be $1\times10^{20}$ cm$^{-3}$ and $2\times10^{-2}$ cm, respectively.

The conductor layer 105 was found to have a flat surface. The flat surface was considered to be formed through reducing of the initial-stage growth rate during formation of the conductor layer 105.

A transmission electron diffraction (TED) pattern of an area in the vicinity of the junction interface between the conductor layer 105 and the upper cladding 104 was captured. In the TED pattern, extra diffraction spots appeared in an ordered pattern along the axis on which (111) diffraction spots appeared. The anomalous diffraction spots were attributed to twins each having a (111) crystal plane as a twinning plane.

Through a conventional cross-section TEM technique, the inside structure of the conductor layer 105 was observed. The results indicated that a large amount of twins each having a (111) crystal plane serving as a twinning plane were present particularly in the junction interface between the conductor layer 105 and the upper cladding 104.

The conductor layer 105 of the stacked structure 11 was joined to the light-permeable substrate 106 through the following procedure, to thereby form a pn-junction compound semiconductor light-emitting device.

Figure 2:
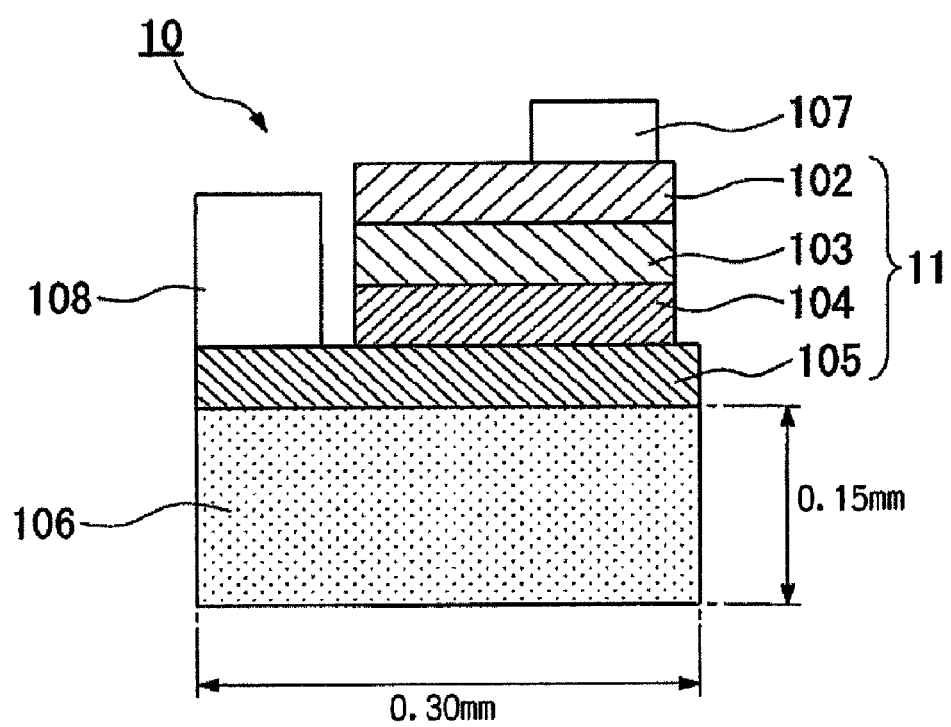
FIG. 2 shows a schematic cross-sectional view of an exemplary structure of a pn-junction compound semiconductor light-emitting device of Example 1.
Figure 3:
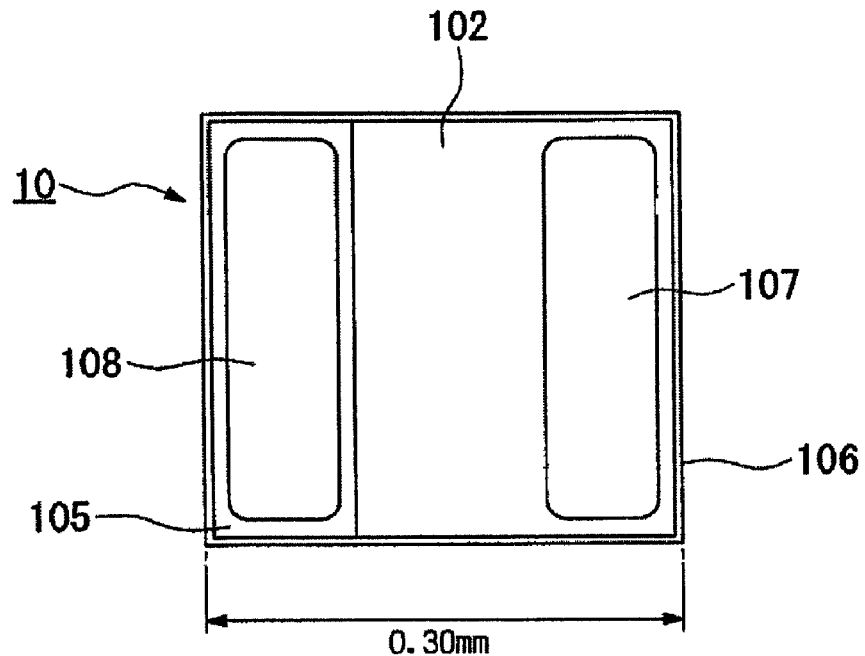
FIG. 3 shows a schematic plan view of an exemplary structure of the pn-junction compound semiconductor light-emitting device of Example 1.

FIG. 2 is a schematic cross-sectional view of an exemplary structure of a pn-junction compound semiconductor light-emitting device 10, and FIG. 3 a schematic plan view of an exemplary structure of the pn-junction compound semiconductor light-emitting device 10.

The conductor layer 105 and a light-permeable substrate 106 composed of a colorless transparent borosilicate glass plate were joined to each other through an anodic joining means. Joining conditions during anodic joining included an applied voltage of 800 V and a temperature of 500° C. The employed light-permeable substrate 106 had a thickness of 0.15 mm, a thermal expansion coefficient of about $6 \times 10^{-6}$/K, and a refractive index of 1.3.

As described above, the conductor layer 105 had a flat surface. Therefore, the conductor layer 105 and the light-permeable substrate 106 could be joined to each other with high adhesion.

After joining of the conductor layer 105 and the light-permeable substrate 106, the GaAs crystal substrate 100 employed for forming the stacked structure 11 was removed through etching with an aqueous ammonium-hydrogen peroxide ($H_2O_2$) mixture.

Subsequently, the GaAs buffer layer 101 was removed through etching, to thereby expose a surface of the lower cladding layer 102. On the entire surface of the exposed lower cladding layer 102, gold (Au)-beryllium (Be) alloy film, nickel (Ni) film, and gold (Au) film were sequentially deposited through conventional vacuum evaporation or electron-beam deposition.

Through selective patterning based on a known photolithographic technique, as shown in FIG. 2, a p-type Ohmic electrode 107 also serving as a pad electrode for wiring was provided on a corner portion of the top surface of the lower cladding layer 102.

A portion throughout the lower cladding layer 102, the light-emitting layer 103, and the upper cladding layer 104 corresponding to the area where an n-type Ohmic electrode 108 was to be formed was removed through etching, thereby exposing the surface (the surface opposite the junction interface with the light-permeable substrate 106) of the conductor layer 105.

Through a known photolithographic technique and selective patterning, the n-type Ohmic electrode 108 composed of gold-germanium (Au.Ge) vacuum-evaporated film was formed on the surface of the conductor layer 105 exposed through etching.

The stacked structure 11 was cut, to thereby produce pn-junction compound semiconductor light-emitting devices (LED chips) 10 each having a square (300 μm×300 μm) shape in plan view.

Figure 4:
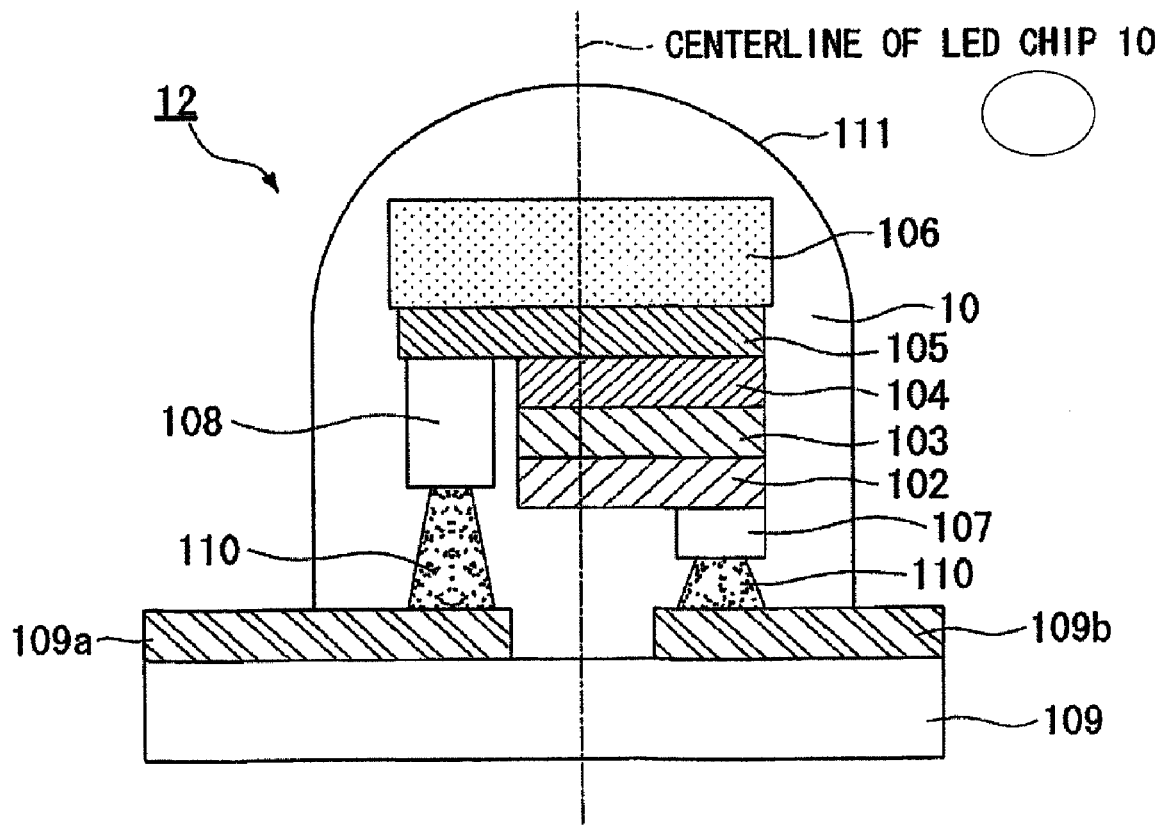
FIG. 4 shows a schematic cross-sectional view of an exemplary light-emitting device including the LED chip of Example 1.

FIG. 4 is a schematic cross-sectional view of an exemplary light-emitting device including the LED chip of Example 1.

A support 109 on which wiring circuits 109a and 109b were patterned was provided.

The LED chip 10 was temporally fixed such that the light-permeable substrate 106 faced upward and the p-type and n-type Ohmic electrodes 107 and 108 faced opposite the wiring circuits 109b and 109a, respectively. While the position was maintained, the p-type and n-type Ohmic electrodes 107 and 108 were electrically connected to the wiring circuits 109b and 109a, respectively, by the mediation of metal bumps 110, whereby the LED chip 10 was mounted on the support 109.

Subsequently, the thus-mounted LED chip 10 was encapsulated with a colorless, transparent epoxy resin 111, thereby fabricating a light-emitting device 12.

Upon encapsulating the LED chip 10 with the epoxy resin 111, the epoxy resin 111 was shaped such that the upper surface and the side surfaces of the light-permeable substrate 106 serving as light-emitting surfaces of the LED chip 10 were surrounded by a hemi-spherical lens having a semi-circular cross-section and such that the vertex of the hemisphere was on the center axis of the LED chip 10.

When a forward device operation current (20 mA) was caused to flow between the p-type and the n-type Ohmic electrodes 107 and 108 through wires 109a and 109b provided on the support 109, the LED chip 10 emitted a yellowish green light having a center wavelength of about 610 nm.

The conductor layer 105 was formed from boron arsenide phosphide having a wide bandgap and low resistance, and the light-permeable substrate 106 was provided in the LED chip 10. Therefore, light emission was visually observed in virtually the entire surface of the light-emitting layer 103 other than the projection area of the p-type Ohmic electrode 107.

A near field pattern of the emitted light indicated that the light emitted from the light-emitting layer 103 other than the above projection area had virtually uniform intensity.

The luminance (emission intensity) of the light emitted from each chip, as determined through a typical integrating sphere, was 320 mcd. Furthermore, by virtue of the n-type Ohmic electrode 108 provided directly on the low-resistance conductor layer 105, forward voltage (Vf) was found to be as low as 2.3 V, whereas a high reverse voltage exceeding 8 V was attained at a reverse current of 10 μA.

As described above, the LED chip 10 according to the present invention exhibits low forward current and resistance, facilitates flow of device operation current, and exhibits high efficiency of extracting light to the outside. Thus, the LED chip can emit high-intensity light.

Through employment of such an LED chip, a light-emitting device which can emit high-intensity light can be provided.

Example 2

An LED chip 20 is different from the LED chip of Example 1 in that an undoped n-type boron phosphide layer is provided as a conductor layer 205.

The present invention will next be described by way of Example 2. The same component members as employed in Example 1 are represented by the same reference numerals.

Figure 5:
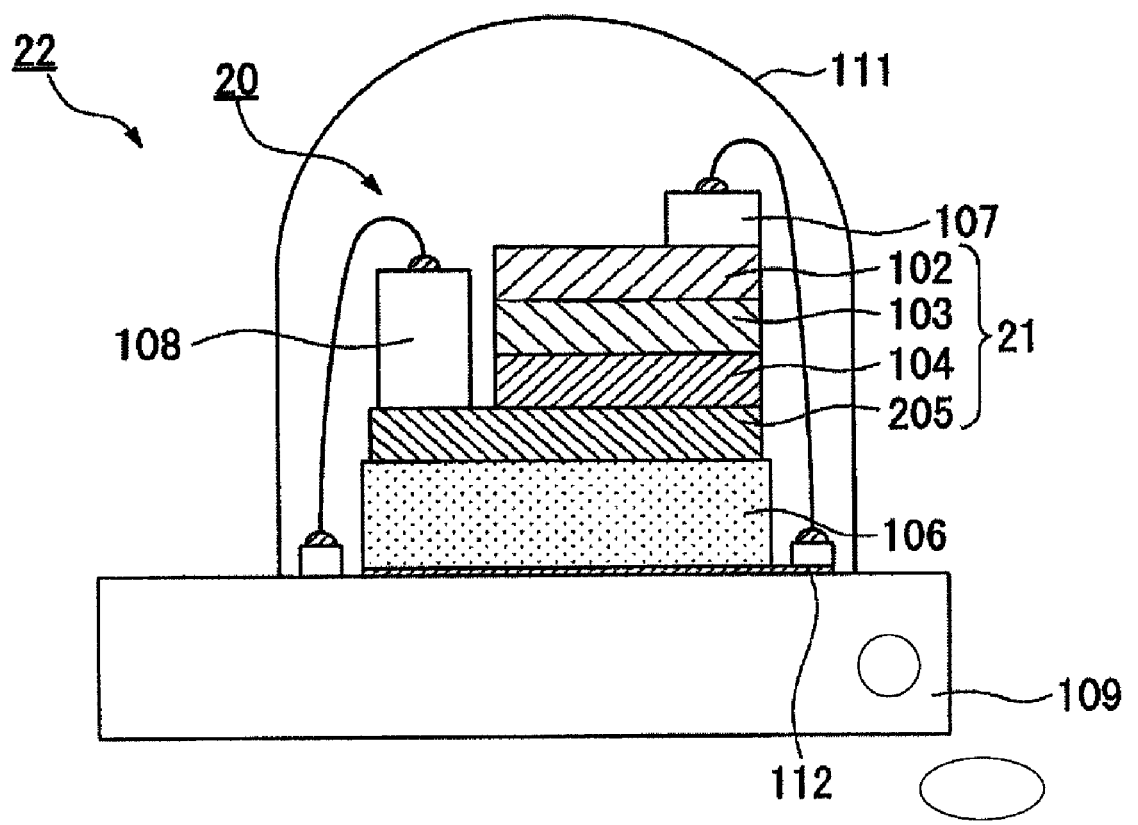
FIG. 5 shows a schematic cross-sectional view of an exemplary lamp including the LED chip of Example 2.

FIG. 5 is a schematic cross-sectional view of an exemplary LED lamp 22 including the LED chip 20 of Example 2.

In a manner similar to that of Example 1, component layers 101 to 104 of a stacked structure 21 other than the conductor layer 205 were formed on a single-crystal substrate 100.

Subsequently, an undoped n-type boron phosphide (BP) layer serving as the conductor layer 205 was formed on an upper cladding layer 104.

The conductor layer 205 composed of undoped n-type boron phosphide (BP) was formed at 800° C. through an atmospheric pressure (near atmospheric pressure) metal-organic chemical vapor deposition (MOCVD) means by use of triethylborane (molecular formula: $(C_2H_5)_3B$) as a boron (B) and phosphine (molecular formula: $PH_3$) as a phosphorus (P) source. The thickness of the conductor layer 205 was adjusted to 750 nm.

The thus-formed conductor layer 205 was found to have a carrier concentration and the resistivity of $8 \times 10^{19}$ cm$^{-3}$ and $6 \times 10^{-2}$ Ω·cm, respectively.

The refractive index and extinction coefficient of the conductor layer 205 were determined by use of a conventional ellipsometer, and the bandgap at room temperature of the conductor layer 205, as calculated from the determined refractive index and extinction coefficient, was about 4.8 eV. Thus, the bandgap assures transmission of the light emitted from the light-emitting layer 103.

In a manner similar to that of Example 1, the conductor layer 205 serving as the uppermost surface of the stacked structure 21 was joined to the light-permeable substrate 106 composed of a borosilicate glass plate through an anodic joining means.

After joining of the substrate 106, a GaAs crystal substrate 100 was removed, to thereby expose a surface of the lower cladding layer 103.

On the thus-exposed surface of the lower cladding layer 103, a p-type Ohmic electrode 107 having an Au—Ge/Ni/Au tri-layer structure was provided at the same position as that of Example 1 as shown in FIG. 2.

A portion throughout the lower cladding layer 102, light-emitting layer 103, and upper cladding layer 104 corresponding to the area where an n-type Ohmic electrode 108 was to be formed was removed through etching, thereby exposing the surface (the surface opposite the junction interface with the light-permeable substrate 106) of the conductor layer 205.

Through a known photolithographic technique and selective patterning, the n-type Ohmic electrode 108 composed of gold-beryllium (Au.Be) vacuum-evaporated film was formed on the exposed surface of the conductor layer 105.

The stacked structure 21 was cut, to thereby produce LED chips 20 each having a square (400 μm×400 μm) in plan view.

A support 109 having a surface coated with silver (Ag) film 112 was provided. As shown in FIG. 5, the LED chip 20 was mounted on the Ag film 112 of the support 109 such that the light-permeable substrate 106 served as a lower layer (i.e., in contact with the support 109).

Subsequently, the p-type and the n-type Ohmic electrodes 107 and 108 were individually wired so as to electrically connected to wiring circuits, respectively (not illustrated in FIG. 5). The thus-formed LED chip 20 was encapsulated with epoxy resin, to thereby fabricate an LED lamp 22.

When a forward device operation current (20 mA) was caused to flow between the p-type and the n-type Ohmic electrodes 107 and 108, the forward voltage was lowered to 2.3 eV, and a high reverse voltage of 8 V was attained at a reverse current of 10 μA, indicating excellent rectifying characteristics.

When a forward device operation current (20 mA) was caused to flow, the LED chip 20 emitted an reddish orange light having a center wavelength of about 610 nm. The luminance (emission intensity) of the light emitted from the LED lamp 22, as determined through a typical integrating sphere, was about 340 mcd.

The above results indicated that, through employment of the LED chip 20 according to the present invention, an LED lamp 22 which can emit high-intensity light can be provided.

According to the pn-junction compound semiconductor light-emitting device of the present invention, the conductor layer is composed of a boron-containing Group III-V compound semiconductor. Thus, in the pn-junction compound semiconductor light-emitting device, the conductor layer and the light-permeable substrate are joined to each other with high adhesion. On the conductor layer, an Ohmic electrode can be reliably formed.

Therefore, the invention provides a pn-junction compound semiconductor light-emitting device which has low resistance, allows device operation current to easily flow, and exhibits excellent efficiency of extraction of light to the outside.

Since the conductor layer has a bandgap at room temperature which is greater than that of the light-emitting layer, the light emitted from the light-emitting layer can be caused to transmit to the light-permeable substrate with low transmission loss, whereby high emission intensity can be attained.

Since the conductor layer is composed of an undoped Group III-V compound semiconductor containing boron to which an impurity element has not been intentionally added, the phenomenon that the added impurity element diffuses into the light-emitting layer or other layers, thereby varying forward voltage or other properties of a pn-junction compound semiconductor light-emitting device does not occur, and low forward current can be attained.

Since the conductor layer is composed of a Group III-V compound semiconductor containing arsenic and boron, an electrode exhibiting excellent Ohmic contact characteristics can be formed on the conductor layer, whereby low forward current can be attained.

Since the conductor layer is composed of a Group III-V compound semiconductor containing phosphorus and boron or a Group III-V compound semiconductor containing arsenic and boron (boron arsenide phosphide), a wide bandgap is obtained and the light emitted from the light-emitting layer can be caused to transmit to the light-permeable substrate with lower transmission loss, whereby higher emission intensity can be attained.

Since the conductor layer is composed of a boron-containing Group III-V compound semiconductor containing twins, lattice mismatch between the conductor layer and a base layer is mitigated, thereby yielding a conductor layer with high crystallinity. Thus, a pn-junction compound semiconductor light-emitting device which has lower resistance and exhibits excellent efficiency of extraction of light to the outside can be produced.

According to the method for producing a pn-junction compound semiconductor light-emitting device, an n-type or a p-type conductor layer composed of a boron-containing Group III-V compound semiconductor is formed to provide a joining layer for joining the stacked structure and the light-permeable substrate. Thus, the conductor layer and the light-permeable substrate can be joined to each other at low temperature with high adhesion without using a light-irradiation means such as YAG laser for heating in combination.

According to the method, formation of a high-resistance layer composed of an oxide or another substance and thermal diffusion of an impurity element added to a component layer of the stacked structure can be prevented, such phenomena conventionally occurring in the case where a conductor layer composed of gallium phosphide or a similar substance and a light-permeable substrate are joined at high temperature. On the conductor layer, an Ohmic electrode can be reliably formed.

According to the method, a pn-junction compound semiconductor light-emitting device which has low resistance, allows device operation current to easily flow, and exhibits excellent efficiency of extraction of light to the outside can be produced.

Since the crystal substrate is removed after joining of the conductor layer to the light-permeable substrate, light absorption by the crystal substrate can be avoided, and a pn-junction compound semiconductor light-emitting device which exhibits excellent efficiency of extraction of light to the outside can be produced.

According to the method, the conductor layer is formed through crystal growth at a growth rate of 20 nm/min to 30 nm/min until the conductor layer thickness reaches 10 nm to 25 nm, followed by crystal growth at a growth rate less than 20 nm/min until the conductor layer comes to have a thickness of interest. Therefore, twins are incorporated into the conductor layer, whereby a conductor layer with high crystallinity can be formed.

Since crystal growth is continued at a growth rate less than 20 nm/min until the conductor layer comes to have a thickness of interest, a conductor layer having high surface flatness can be formed, whereby the conductor layer and the light-permeable substrate can be joined to each other with high adhesion.

INDUSTRIAL APPLICABILITY

The present invention provides a pn-junction compound semiconductor light-emitting device having a light-emitting layer composed of an n-type or a p-type aluminum gallium indium phosphide for emitting light of various wavelength and particularly, a high-luminance LED for use in a display element or an electronic apparatus such as an optical communication apparatus.

The invention claimed is:

1. A method for producing a pn-junction compound semiconductor light-emitting device comprising the steps of:
    forming a stacked structure through sequentially stacking on a crystal substrate a lower cladding layer, a light-emitting layer composed of n-type or p-type aluminum gallium indium phosphide, an upper cladding layer, and an n-type or a p-type conductor layer composed of an undoped boron-containing Group III-V compound semiconductor, and a step of joining the conductor layer to a light-permeable substrate;
    wherein the crystal substrate is removed after joining of the conductor layer to the light-permeable substrate, and
    wherein the conductor layer is formed though crystal growth at a growth rate of 20 nm/min to 30 nm/min and contains twins, having, as a twining plate, a (111) lattice plane of the boron containing Group III-V compound semiconductor.

2. The method for producing a pn-junction compound semiconductor light-emitting device according to claim 1, wherein the conductor layer is formed through crystal growth at a growth rate of 20 nm/min to 30 nm/min until the conductor layer thickness reaches 10 nm to 25 nm, followed by crystal growth at a growth rate less than 20 nm/min until the conductor layer comes to have a thickness of interest.

3. The method for producing a pn-junction compound semiconductor light-emitting device according to claim 1, wherein the conductor layer is composed of an undoped BP-based semiconductor.

* * * * *